(12) United States Patent
Lewis et al.

(10) Patent No.: US 6,193,068 B1
(45) Date of Patent: Feb. 27, 2001

(54) CONTAINMENT DEVICE FOR RETAINING SEMICONDUCTOR WAFERS

(75) Inventors: Lee Lewis, Murphy, TX (US); Kurodearimasu Takeshi Hirose, Tsuchiura Ibaragi (JP); Jeffrey Wilson, Sherman, TX (US); James Dove, Rockwall, TX (US); Michael Hayden, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/298,103

(22) Filed: Apr. 22, 1999

Related U.S. Application Data

(60) Provisional application No. 60/084,612, filed on May 7, 1998.

(51) Int. Cl.⁷ ............................ B65D 85/30; B65D 85/02; B65D 21/02
(52) U.S. Cl. ........................ 206/710; 206/303; 206/509; 206/722
(58) Field of Search .................................... 206/710–712, 206/724–725, 328, 334, 303, 722, 509; 220/4.21, 4.24

(56) References Cited

U.S. PATENT DOCUMENTS

| | | | |
|---|---|---|---|
| 3,552,548 | * 1/1971 | Wallestad et al. | 206/710 |
| 3,672,495 | * 6/1972 | Bauer et al. | 206/712 |
| 4,120,398 | * 10/1978 | Braddor, Sr. | 206/303 X |
| 4,886,162 | * 12/1989 | Ambrogio | 206/710 |
| 5,024,329 | * 6/1991 | Grohrock | 206/710 |
| 5,103,926 | * 4/1992 | Murphy | 206/725 X |
| 5,211,717 | * 5/1993 | Skoura | 206/710 |
| 5,284,802 | * 2/1994 | Muranoka et al. | 206/710 X |
| 5,366,079 | * 11/1994 | Lin et al. | 206/710 |
| 5,474,177 | * 12/1995 | Abrams et al. | 206/710 |
| 5,547,082 | * 8/1996 | Royer et al. | 206/725 |
| 5,553,711 | * 9/1996 | Lin et al. | 206/710 |
| 5,724,748 | * 3/1998 | Brooks et al. | 206/711 X |

* cited by examiner

*Primary Examiner*—Bryon P. Gehman
(74) *Attorney, Agent, or Firm*—Jacqueline J. Garner; Wade James Brady, III; Frederick J. Telecky, Jr.

(57) ABSTRACT

A containment device for retaining semiconductor wafers (54) is disclosed. The containment device comprises a first housing member (10) having a frame (12), an inner wall (14) and an outer wall (16). The inner wall (14) and outer wall (16) each extend generally perpendicularly from the frame (12). The inner wall (14) and outer wall (16) have a spaced apart relationship forming a gap (18) therebetween. The inner wall (14) closely receives the semiconductor wafers (54). The containment device also comprises a second housing member (36) that is securably attachable to the first housing member (10). The second housing member (36) has a frame (38) that forms the top of the containment device when the first and second housing members (10, 36) are securably attached together.

30 Claims, 5 Drawing Sheets

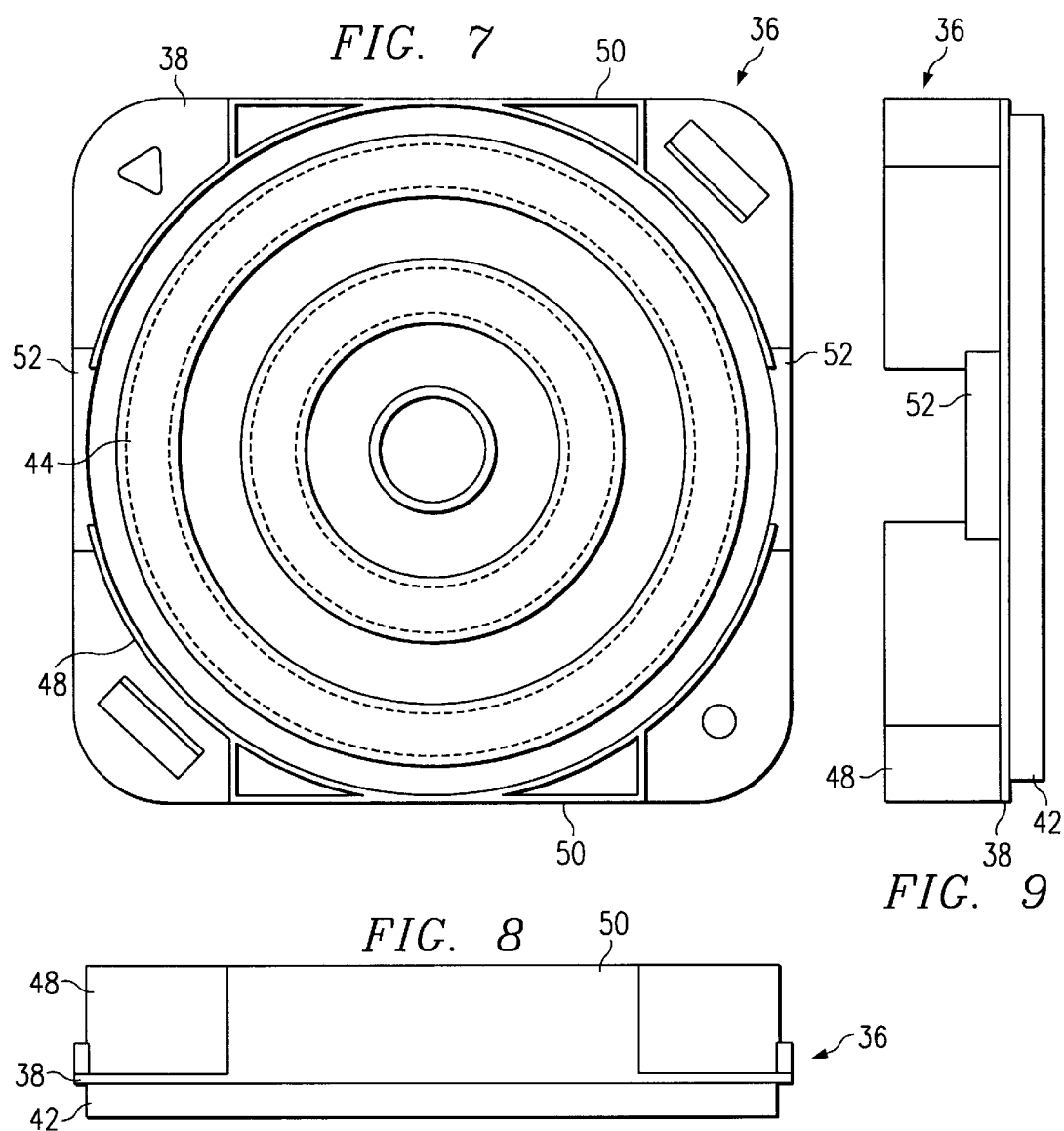

CONTAINMENT DEVICE FOR RETAINING SEMICONDUCTOR WAFERS

This application claims priority under 35 U.S.C. §119 (e)(1) of provisional application No. 60/084,612, filed May 7, 1998.

TECHNICAL FIELD OF THE INVENTION

This invention relates in general to a containment device and in particular to a containment device for retaining semiconductor wafers that provides for automated loading and unloading of the semiconductor wafers therein while minimizing the breakage of the semiconductor wafers during loading, unloading and transporting.

BACKGROUND OF THE INVENTION

Without limiting the scope of the present invention, its background will be described with reference to transporting semiconductor wafers from one site to another.

Heretofore in this field, it has been necessary to transport semiconductor wafers from one fabricating facility to another between certain steps in the fabrication process. The process for packaging the semiconductor wafers for shipment was typically a manual process which required placing each of the semiconductor wafers into individual electrostatic discharge bags in order to prevent the buildup of static charge on the semiconductor wafer that may otherwise occur during handling. The static charge must be prevented in order to avoid causing short circuits within the semiconductor wafer.

Once the semiconductor wafers were placed into electrostatic discharge bags, the semiconductor wafers were placed into a styrofoam box. The styrofoam box was typically treated with a topical anti-static coating such as Staticide made by ACL Corporation or other quaternary compounds. The use of the topical anti-static coating on the styrofoam box further prevented the buildup of static charge during handling of the semiconductor wafers.

It has been found, however, that the use of styrofoam boxes could promote the corrosion of semiconductor wafers due to the potential moisture retention by the styrofoam. The typical process used to mold the styrofoam box is a steam process wherein beads of styrofoam are exposed to steam which causes them to expand and allows them to be formed into the shape of a box. If the styrofoam boxes are not properly dried, the residual moisture within the styrofoam box may cause corrosion of the semiconductor wafers.

The use of styrofoam boxes also left semiconductor wafers susceptible to breakage. For example, it is estimated that between one and three percent of semiconductor wafers were broken during the manual loading and unloading process as well as during transportation of the semiconductor wafers in the styrofoam box. In addition, the use of styrofoam boxes to transport silicon wafers resulted in high costs associated with the manufacture and disposal of the styrofoam boxes which in most cases were not re-used or recycled.

Therefore, a need has arisen for a containment device for retaining semiconductor wafers that will allow for automated loading and unloading of semiconductor wafers, thereby minimizing the breakage of semiconductor wafers associated with the transportation of semiconductor wafers from one facility to another. A need has also arisen for such a containment device that dissipates static charge without the need to manually place the semiconductor wafers within an electrostatic discharge bag. A need has further arisen for a containment device for retaining semiconductor wafers that does not promote corrosion of the semiconductor wafers. Additionally, a need has arisen for such a containment device that is re-usable, thereby minimizing both the manufacturing and disposal costs associated with transporting semiconductor wafers.

SUMMARY OF THE INVENTION

The present invention disclosed herein comprises a containment device for retaining semiconductor wafers that provides for automated loading and unloading of the semiconductor wafers therein while minimizing the breakage of the semiconductor wafers during loading, unloading and transporting. The containment device of the present invention dissipates static electricity through the use of conductive materials and does not promote corrosion of the semiconductor wafers as the materials used do not retain moisture. Additionally, the containment device of the present invention is reusable, thereby reducing both the manufacturing and environmental costs associated with transporting semiconductor wafers.

The containment device of the present invention comprises a first housing member having a frame, an inner wall and an outer wall. The inner and outer walls extend generally perpendicularly from the frame and have a spaced apart relationship forming a gap therebetween, the inner wall closely receiving the semiconductor wafers to prevent radial movement of the semiconductor wafer during transportation. The containment device also includes a second housing member that is securably attachable to the first housing member. The second housing member has a frame that forms the top of the containment device when the first and second housing members are securably attached together.

The inner and outer walls of the containment device each have a slot that allows for automated loading and unloading of semiconductor wafers. In addition, the inner wall has a notch for establishing the maximum depth of semiconductor wafers to be retained within the containment device. Both the frame of the first housing member and the frame of the second housing member may include reinforcement members for minimizing flexure of the containment device during transportation. The second housing member may further include a wall that extends generally perpendicularly from the frame of the second housing member that is disposed exteriorly of the outer wall of the first housing member when the first and second housing members are securably attached together. The frame of the second housing member may also include a spacer member that minimizes the axial movement of the semiconductor wafers within the containment device when the first and second housing members are securably attached together.

The first housing member and the second housing member are securably attached together using one or more latches that are hingably mounted to the first housing member. Each latch has a hook that is received within a hole in the frame of the second housing member. Once the first housing member and the second housing member are securably attached together, similar containment devices may be stacked one on top of another using the respective lips of the first housing members and the second housing members.

Prior to loading the containment device with semiconductor wafers, a cushion is placed in the bottom of the first housing member. A wafer separator is then place on top of the cushion. Thereafter, numerous semiconductor wafers are place within the containment device and closely received within the inner wall of the first housing member using an automated process. This process includes placing a wafer separator between each semiconductor wafer. Once the level of the semiconductor wafers reaches the notch of the inner wall of the first housing member, a cushion is placed on top of the last semiconductor wafer with a wafer separator therebetween. The second housing member may then be securely attached to the first housing member.

The materials selected for the containment device of the present invention must not only protect the semiconductor wafers from impacts or shocks to the exterior of the containment device but must also protect the semiconductor wafers from the ubiquitous build up of internal static. Specifically, the first and second housing members are constructed from a conductive material such as a carbon impregnated polypropylene. Similarly, the wafer separators are constructed from a conductive material which may be a carbon impregnated polyethylene. Additionally, the cushions used above and the below the stack of semiconductor wafers may be constructed from an anti-static foam.

BRIEF DESCRIPTION OF THE DRAWINGS

For a more complete understanding of the present invention, including its features and advantages, reference is now made to the detailed description of the invention, taken in conjunction with the accompanying drawings in which like numerals identify like parts and in which:

FIG. 7 is a bottom view of the upper portion of a containment device of the present invention;

FIG. 8 is a side view of the upper portion of the containment device of FIG. 7;

FIG. 9 is a side view of the upper portion of the containment device of FIG. 7.

DETAILED DESCRIPTION OF THE INVENTION

While the making and using of various embodiments of the present invention is discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the invention.

Figure 1:
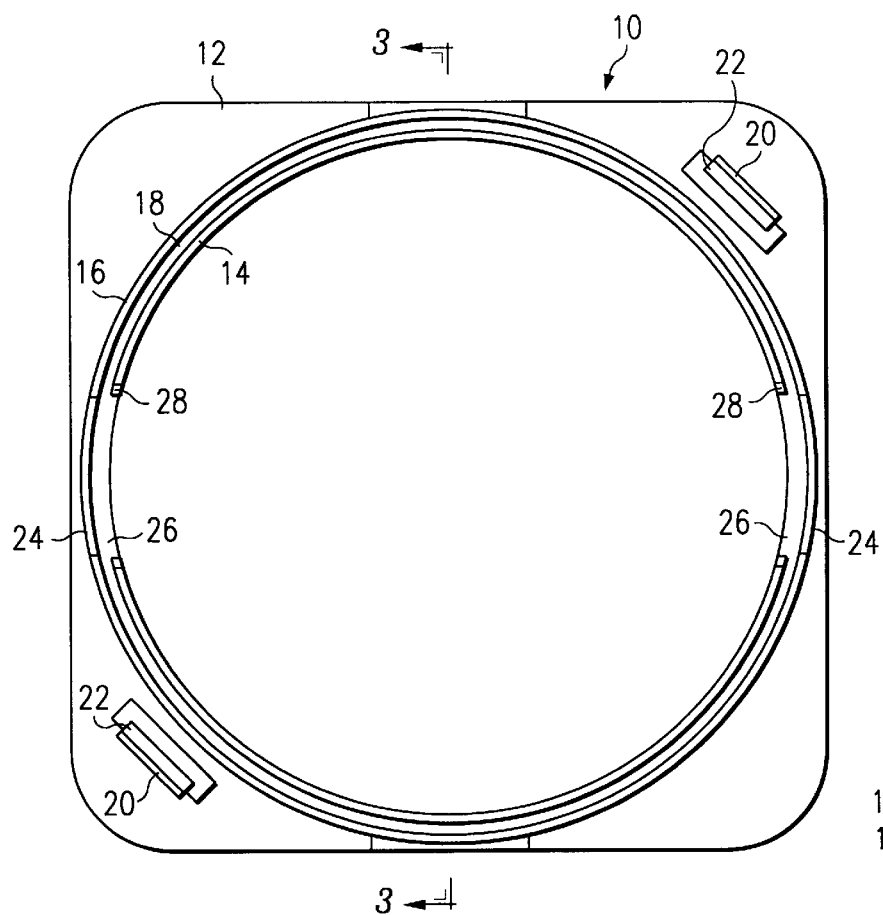
FIG. 1 is a top view of the lower portion of a containment device of the present invention.

Referring to FIG. 1, a lower housing member of a containment device for retaining semiconductor wafers is depicted and generally designated 10. Lower housing member 10 includes a substantially planar frame 12 upon which semiconductor wafers will be placed. Extending generally perpendicularly from frame 12 is inner wall 14. Inner wall 14 is sized to closely receive the semiconductor wafers that will be retained within the containment device of the present invention. For example, inner wall 14 may be sized to receive 6 inch, 8 inch, 12 inch or other diameter semiconductor wafers. Also extending generally perpendicularly from frame 12 is an outer wall 16. Between inner wall 14 and outer wall 16 is a gap 18. Together outer wall 16 and gap 18 protect the semiconductor wafers from the direct transmission of forces that my contact outer wall 16 during the transportation of semiconductor wafers within the containment device of the present invention.

Figure 2:
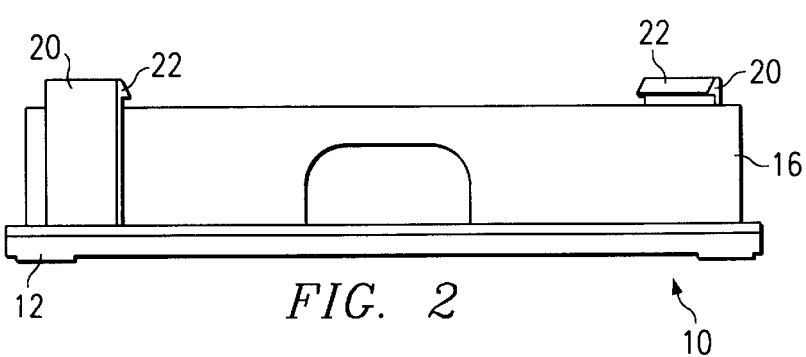
FIG. 2 is a side view of the containment device of FIG. 1.

As best seen in FIG. 2, a pair of latches 20 extend generally perpendicularly from frame 12. Each of the latches 20 includes a hook 22 that will securably attach lower housing member 10 to an upper housing member as will be more fully discussed with reference to FIG. 5.

Figure 3:
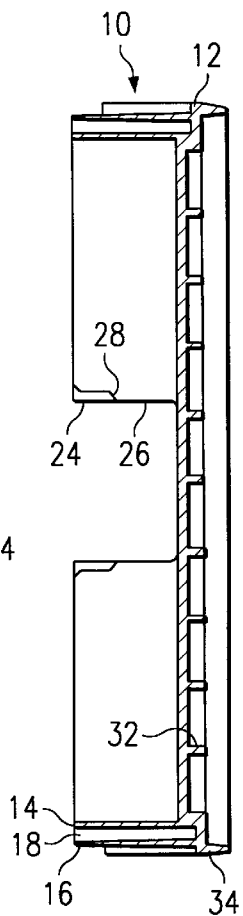
FIG. 3 is a cross sectional view of the containment device of the present invention taken along line 3—3 of FIG. 1.

Referring now to FIGS. 1 and 3, outer wall 16 includes a pair of oppositely disposed slots 24. Similarly, inner wall 14 has a pair of oppositely disposed slots 26. Together, slots 24 and slots 26 allow for the automated loading and unloading of semiconductor wafers using a typical wafer loading arm. In addition, inner wall 14 includes a pair of oppositely disposed notches 28 that are used to determine the maximum height for stacking semiconductor wafers within lower housing member 10 of the containment device of the present invention.

Figure 4:
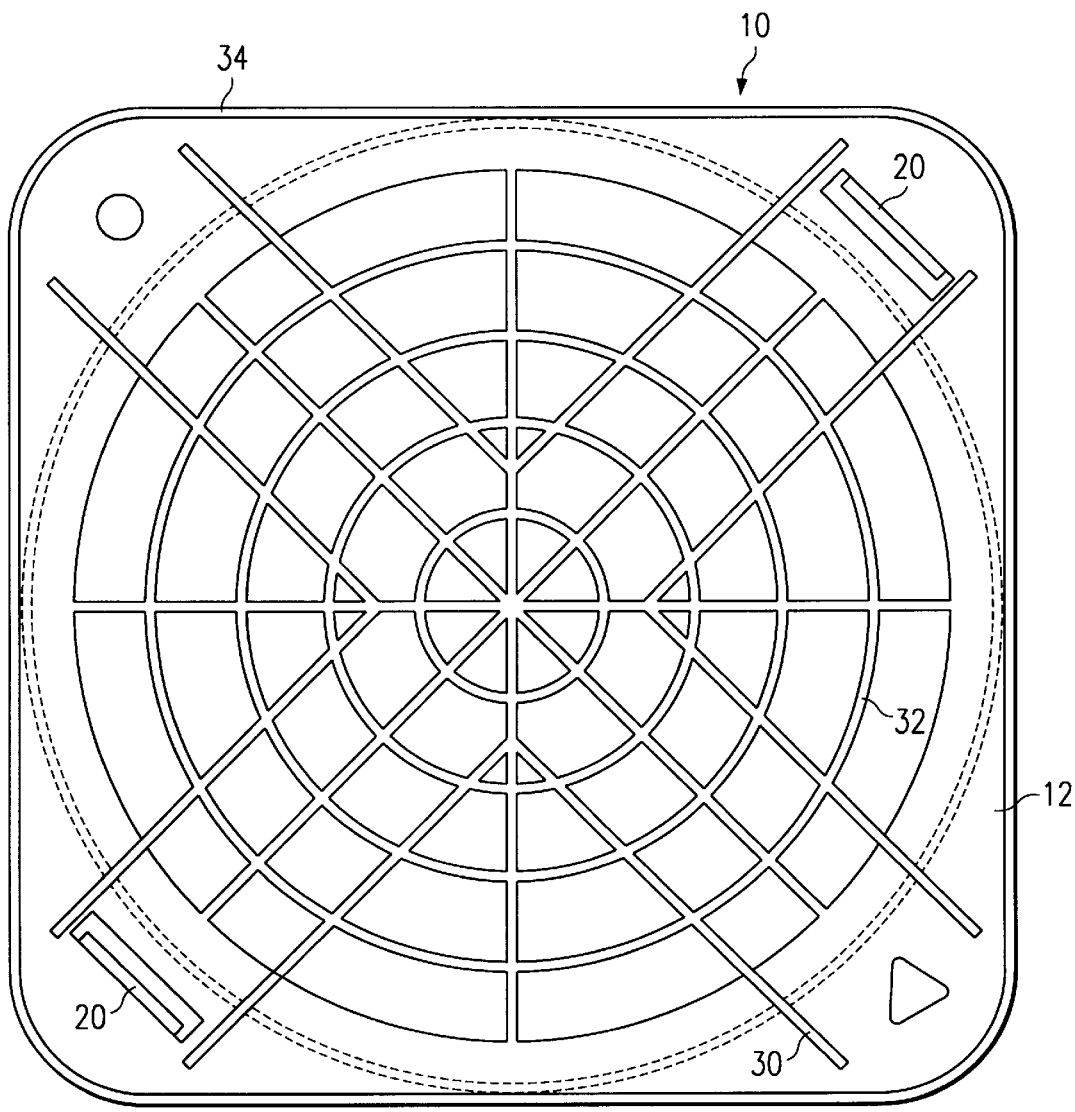
FIG. 4 is a bottom view of the lower portion of a containment device of the present invention.

Referring now to FIG. 4, a top view of lower housing member 10 is depicted. Frame 12 of lower housing member 10 includes a plurality of reinforcement members including ribs 30 and rings 32. As best seen in FIG. 3, rings 32, as well as ribs 30, extend outwardly from the bottom surface of frame 12 and prevent the flexure of frame 12 during, for example, loading, unloading and transporting semiconductor wafers within the containment device of the present invention. Additionally, frame 12 includes an outer lip 34 that will mesh with an outer lip of an upper housing member of the containment device of the present invention as will be more fully explained with reference to FIG. 5.

Lower housing member 10 may be constructed from any suitably rigid material that provides support and containment for the semiconductor wafers to be disposed therein. For example, lower housing member 12 may be constructed from a plastic such as polypropylene. In addition, it has been found that the use of a conductive material will minimize the buildup of static charge on the semiconductor wafers disposed within lower housing member 10. For example, a carbon impregnated polypropylene is suitable for discharging such static buildup.

Figure 5:
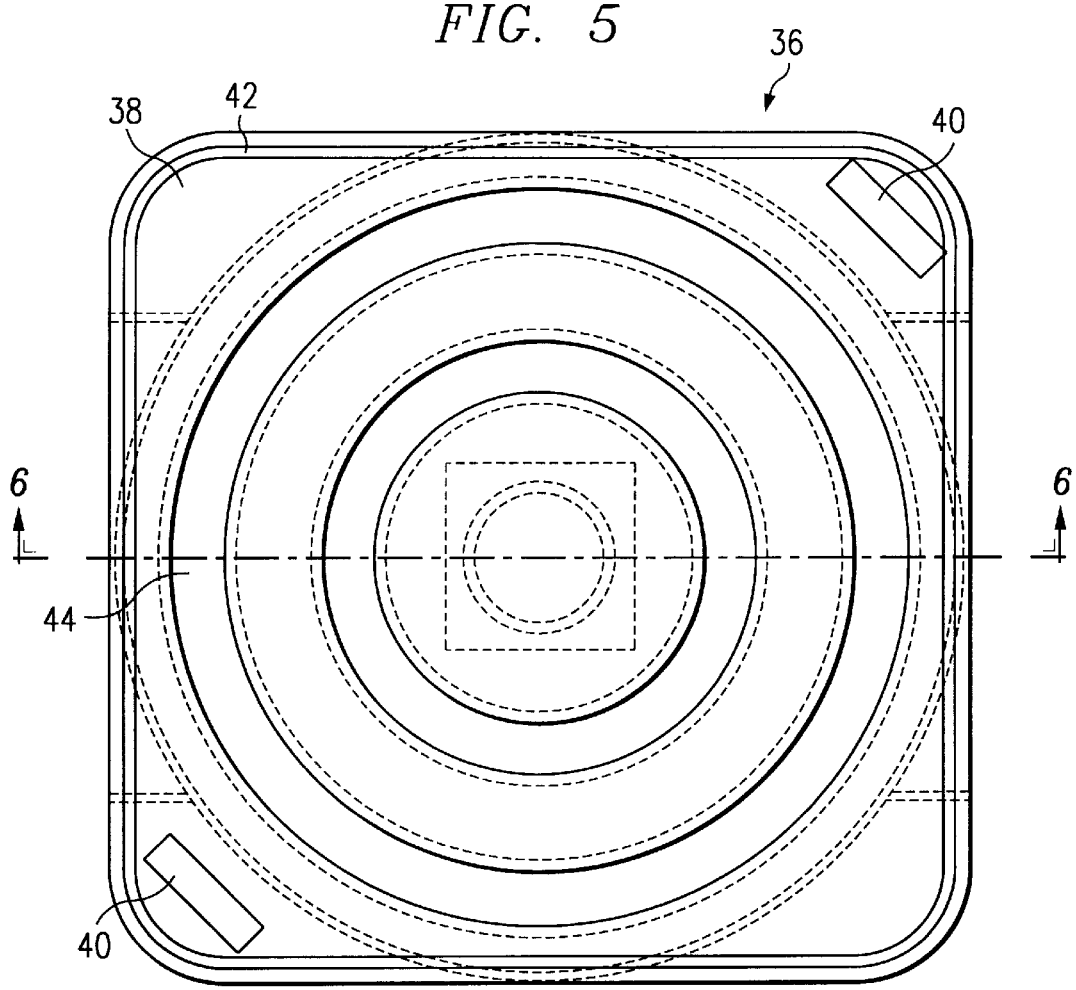
FIG. 5 is a top view of the upper portion of a containment device of the present invention.

Referring now to FIG. 5, a top view of the upper housing member is depicted and generally designated 36. Upper housing member 36 includes a frame 38 that is generally planar. Frame 38 includes a pair of oppositely disposed holes that are designed to receive hooks 22 of latches 20 of lower housing member 10. In operation, latches 20 are hingably attached to lower housing member 10 such that hooks 20 may be radially deflected outward as the inner surface of holes 40 come in contact with the angled surface of hooks 20 as best seen in FIG. 2. When hooks 20 extend above holes 40, latches 20 snap radially inwardly so that hooks 20 overlap the inner edge of holes 40 such that lower housing member 10 and upper housing member 36 are securably attached together.

Frame 38 of upper housing member 36 includes an outer lip 42. Outer lip 42 is sized such that it may be closely received within outer lip 34 of lower housing member 10 as best seen in FIG. 3. As such, similarly designed containment devices may be stacked together in a secure manner thereby preventing potential damage to the semiconductor wafers stored therein as the containment devices of the present invention are transported from one location to another.

Figure 6:
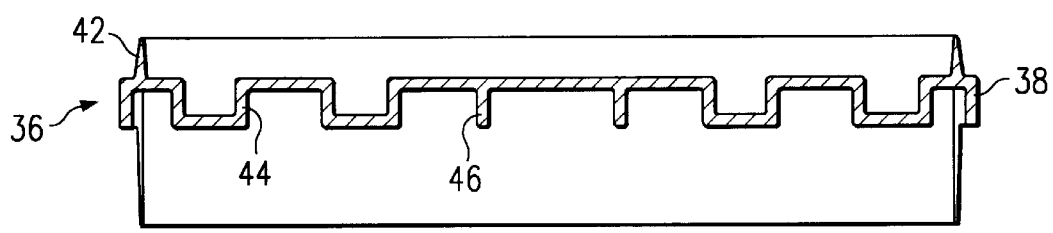
FIG. 6 is a cross sectional view taken along line 6—6 of FIG. 5.

As best seen in FIG. 6, frame 38 includes a series of reinforcement members in the form of concentric rings such as ring 44. The reinforcement members minimize the flexure of upper housing member 36 such that when upper housing member 36 and lower housing member 10 are securably attached together, protection is provided for the semiconductor wafers disposed therein. Inwardly extending from frame 38 is a spacer 46 that contacts the upper surface of the semiconductor wafers stacked within the containment device of the present invention. Spacer 46 minimizes the axial movement of the semiconductor wafers within the containment device of the present invention during the transportation of the semiconductor wafers.

Referring now to FIG. 7, a bottom view of upper housing member 36 is depicted. Upper housing member 36 has a wall 48 that extends generally perpendicularly to frame 38. Wall 48 is sized such that when upper housing member 36 is securably attached to lower housing member 10, wall 48 is exteriorly disposed about outer wall 16 of lower housing member 10. Upper housing member 36 also has a pair of oppositely disposed walls 50 that have a planar surface, as best seen in FIGS. 7 and 8. Walls 50 allow adjacent containment devices of the present invention to be packed tightly together in, for example, a shipping box or pallet. Additionally, upper housing member 36 has a pair of oppositely disposed planar walls 52 that provide for tight packing of adjacent containment devices as best seen in FIG. 9.

Figure 10:
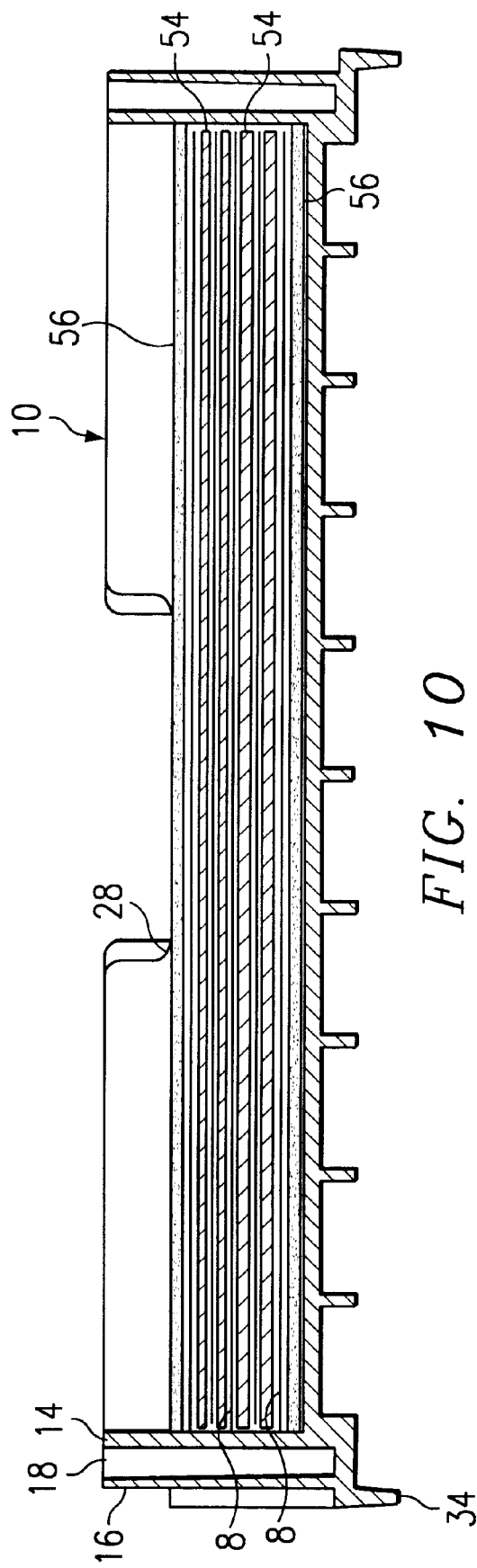
FIG. 10 is a cross sectional view of the lower portion of a containment device of the present invention having semiconductor wafers loaded therein.

Referring now to FIG. 10, a cross sectional view of lower housing member 10 loaded with a plurality of semiconductor wafers 54 is depicted. Prior to loading lower housing member 10 with semiconductor wafers 54, a cushion 56 is placed on the upper surface of frame 12. Cushion 56 provides protection to semiconductor wafers 54 from external shock. Cushion 56 may be constructed from an antistatic foam such that static charge will not develop between cushion 56 and a semiconductor wafer 54. On top of cushion 56 is a wafer separator 58. Wafer separator 58 is constructed from a conductive material having low ionic contamination and minimal loose particles. For example, wafer separator 58 may be constructed from a carbon impregnated polyethylene. The ionic contamination of wafer separator 58 should not exceed 20 $ng/cm^2$ of fluoride ions, chloride ions or sodium ions, should not exceed 30 $ng/cm^2$ of potassium ions or ammonium ions and should not exceed 40 $ng/cm^2$ of bromide ions, phosphate ions, nitride ions or sulfate ions. Additionally, wafer separator 58 should not have more than 100,000 loose particles per cubic foot that exceed 0.5 micrometers.

On top of wafer separator 58 is a semiconductor wafer 54. Thereafter, a plurality of wafer separators 58 and semiconductor wafers 54 may be stacked in sequence. On top of the last semiconductor wafer 54 there is a wafer separator 58. On top of the last wafer separator 58 is an additional cushion 56 that also protects semiconductor wafers 54 from impacts.

While this invention has been described with a reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A containment device for retaining semiconductor wafers comprising:
    a first housing member with means for retaining semiconductor wafers therein having a frame; a circular inner wall and a circular outer wall, the inner and outer walls extending generally perpendicularly from the frame, the inner and outer walls having a spaced apart relationship forming a gap therebetween, the inner wall closely receiving the semiconductor wafers; and
    a second housing member with means for retaining semiconductor wafers therein removably securably attached to the first housing member, the second housing member having a frame that forms the top of the containment device when the first and second housing members are securably attached together.

2. The containment device as recited in claim 1 wherein the inner wall has at least one notch for establishing the maximum depth of semiconductor wafers to be retained therein.

3. The containment device as recited in claim 1 wherein the inner and outer walls each have at least one slot for allowing automated loading and unloading of semiconductor wafers.

4. The containment device as recited in claim 1 wherein the frame of the first housing member includes reinforcement members for minimizing flexure of the first housing member.

5. The containment device as recited in claim 1 wherein the second housing member further comprises a wall extending generally perpendicularly from the frame, the wall disposed exteriorly of the outer wall of the first housing member when the first and second housing members are securably attached together.

6. The containment device as recited in claim 1 wherein the frame of the second housing member includes reinforcement members for minimizing flexure of the second housing member.

7. The containment device as recited in claim 1 wherein the frame of the second housing member includes at least one spacer member for minimizing the axial movement of the semiconductor wafers within the containment device.

8. The containment device as recited in claim 1 further comprising at least one latch hingably mounted to the first housing member, the latch having a hook and wherein the frame of the second housing member has a hole for receiving the hook to securably attached the first and second housing members together.

9. The containment device as recited in claim 1 wherein the first and second housing members further comprise a conductive material.

10. The containment device as recited in claim 9 wherein the conductive material is a carbon impregnated polypropylene.

11. The containment device as recited in claim 1 wherein the first and second housing members each further comprise a lip such that the first and second housing members are stackably mountable.

12. A containment device for retaining semiconductor wafers comprising:
    a first housing member with means for retaining semiconductor wafers therein having a frame; a circular inner wall and a circular outer wall, the inner and outer walls extending generally perpendicularly from the frame, the inner and outer walls having a spaced apart relationship forming a gap therebetween;
    a second housing member with means for retaining semiconductor wafers therein removably securably attached to the first housing member, the second housing member having a frame that forms the top of the containment device when the first and second housing members are securably attached together;

first and second semiconductor wafers closely received within the inner wall of the first housing member; and a first wafer separator disposed between the first and second semiconductor wafers.

13. The containment device as recited in claim 12 further comprising first and second cushions, the first cushion disposed between the first semiconductor and the frame of the first housing member and the second cushion disposed between the second semiconductor and the frame of the second housing member.

14. The containment device as recited in claim 13 further comprising second and third wafer separators, the second wafer separator disposed between the first cushion and the first semiconductor and the third wafer separator disposed between the second cushion and the second semiconductor.

15. The containment device as recited in claim 13 wherein the first and second cushions further comprise an anti-static foam.

16. The containment device as recited in claim 12 wherein the first wafer separator further comprises a conductive material.

17. The containment device as recited in claim 16 wherein the conductive material is a carbon impregnated polypropylene.

18. The containment device as recited in claim 12 wherein the inner wall has at least one notch for establishing the maximum depth of semiconductor wafers to be retained therein.

19. The containment device as recited in claim 12 wherein the inner and outer walls each have at least one slot for allowing automated loading and unloading of the first and second semiconductor wafers.

20. The containment device as recited in claim 12 wherein the second housing member further comprises a wall extending generally perpendicularly from the frame, the wall disposed exteriorly of the outer wall of the first housing member when the first and second housing members are securably attached together.

21. The containment device as recited in claim 12 wherein the frame of the second housing member includes at least one spacer member for minimizing the axial movement of the semiconductor wafers within the containment device.

22. The containment device as recited in claim 12 wherein the first and second housing members further comprise a conductive material.

23. The containment device as recited in claim 22 wherein the conductive material is a carbon impregnated polypropylene.

24. A method for retaining semiconductor wafers in a containment device comprising the steps of:

providing a first housing member with means for retaining semiconductor wafers therein having a frame; a circular inner wall and a circular outer wall, the inner and outer walls extending generally perpendicularly from the frame, the inner and outer walls having a spaced apart relationship forming a gap therebetween;

disposing first and second semiconductor wafers therein such that the first and second semiconductor wafers are closely received within the inner wall of the first housing member;

disposing a first wafer separator disposed between the first and second semiconductor wafers; and securably attaching a second housing member with means for retaining semiconductor wafers therein to the first housing member, the second housing member having a frame that forms the top of the containment device.

25. The method as recited in claim 24 further comprising the steps of disposing a first cushion between the first semiconductor wafer and the frame of the first housing member and disposing a second cushion between the second semiconductor and the frame of the second housing member.

26. The method as recited in claim 25 further comprising the steps of disposing a second wafer separator between the first cushion and the first semiconductor wafer and disposing a third wafer separator between the second cushion and the second semiconductor wafer.

27. The method as recited in claim 25 wherein the first and second cushions further comprise an anti-static foam.

28. The method as recited in claim 24 further comprising the step of dissipating static by utilizing a conductive material for the first wafer separator.

29. The method as recited in claim 24 further comprising the step of minimizing the axial movement of the first and second semiconductor wafers within the containment device with at least one spacer member inwardly extending from the frame of the second housing member.

30. The method as recited in claim 24 further comprising the step of dissipating static by utilizing a conductive material for the first and second housing members.

* * * * *